United States Patent [19]

Manabe

[11] Patent Number: 5,712,812
[45] Date of Patent: Jan. 27, 1998

[54] SEMICONDUCTOR MEMORY DEVICE WITH STACKED CAPACITOR STRUCTURE

[75] Inventor: Kazutaka Manabe, Tokyo, Japan

[73] Assignee: NEC Corporation, Tokyo, Japan

[21] Appl. No.: 695,410

[22] Filed: Aug. 12, 1996

[30] Foreign Application Priority Data

Aug. 11, 1995 [JP] Japan ................................. 7-227092

[51] Int. Cl.⁶ ................................................. G11C 11/24
[52] U.S. Cl. ........................................... 365/149; 365/51
[58] Field of Search ................................. 365/149, 150, 365/51

[56] References Cited

U.S. PATENT DOCUMENTS 5,430,672  7/1995  Kuwabara et al. .................... 365/149

FOREIGN PATENT DOCUMENTS

3-165552  7/1991  Japan .

Primary Examiner—Terrell W. Fears
Attorney, Agent, or Firm—Foley & Lardner

[57] ABSTRACT

In a semiconductor memory device with a stacked capacitor structure, a MOS transistor is formed on a substrate to have a gate electrode, a source region and a drain region. An insulating film is formed on the MOS transistor with an opening passing through the insulting film to one of the source and drain regions of the MOS transistor. A conductive storage electrode is formed such that it is connected to the one of the source and drain regions of the MOS transistor and has a first portion extending along a top surface of the insulating film and a second portion provided at each of edges of the first portion, and including a first subportion extending in an upper direction from an upper surface of the first portion and a second subportion below a lower surface of the first portion. Then, a capacitive insulating film is deposited and a conductive plate electrode film is deposited on the capacitive insulating film to complete a memory cell capacitor with the conductive storage electrode, the capacitive insulating film and the conductive plate electrode. The conductive storage electrode is formed by depositing a first conductive film on the insulating film and forming the first portion of the conductive storage electrode from the first conductive film, etching a surface portion of the insulating film where the first portion is not formed, and depositing a second conductive film and forming the storage electrode second portion from the second conductive film.

20 Claims, 6 Drawing Sheets

Fig. 4C ent conventional example 2 is configured to
have the increased capacitor, which is much larger than the
capacitor having the structure of the above-mentioned conventional example 1.

SEMICONDUCTOR MEMORY DEVICE WITH STACKED CAPACITOR STRUCTURE

BACKGROUND OF THE INVENTION

1. Field of the Invention

The present invention relates to a semiconductor memory device, and more particularly, to a semiconductor memory device such a dynamic random access memory (DRAM) having a stacked capacitor structure in which a memory cell capacitor is formed above a transistor.

2. Description of Related Art

Conventionally, in a DRAM, the reduction of chip size or the realization of large capacity of memory at the same chip area has been developed. The memory capacity of the memory cell capacitor for every unit area has been made large for this reason and the occupation area of the memory cell which area has the same memory capacity is decreased.

Figure 1A:
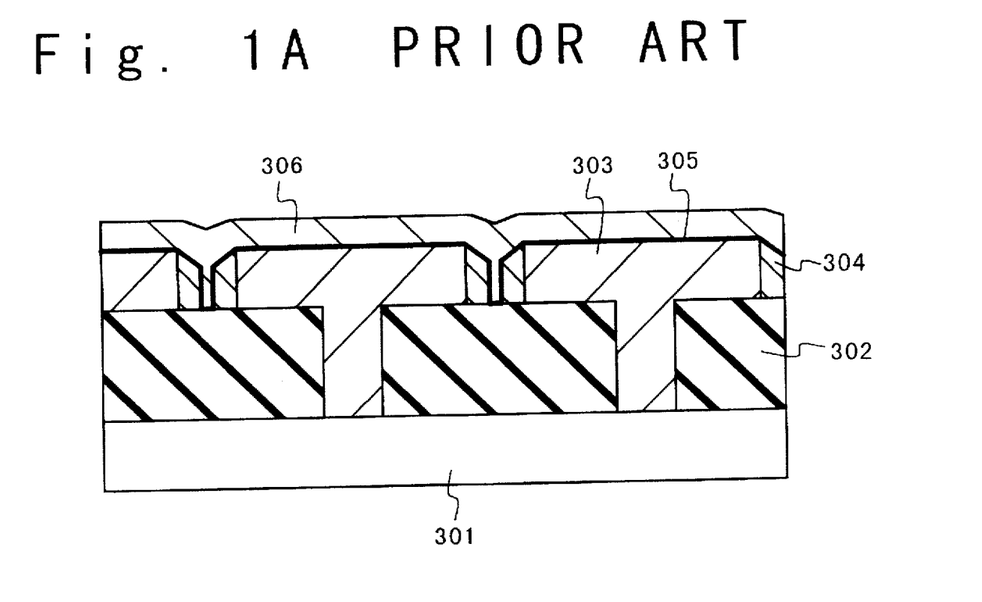
FIG. 1A is a cross sectional view illustrating the capacitor structure of a conventional dynamic random access memory (DRAM) having a stacked capacitor structure.

A conventional DRAM with a stacked capacitor structure is disclosed in, for example, Japanese Laid Open Patent Disclosure (Heisei 3-165552) in which there is proposed the semiconductor memory structure in which conductive side wall films are added to a storage electrode (a memory node electrode) section of the DRAM with the stacked capacitor structure for increasing the capacity of the stacked capacitor per occupation area of the memory cell. FIG. 1 shows only the capacitor structure the main portion of the above conventional example (hereinafter, to be referred to as "a conventional example 1") for easily understanding.

Referring to FIG. 1, a reference numeral 301 denotes a silicon substrate, 302 denotes an insulating film, 303 denotes a polysilicon film, which constitutes a main portion of a storage electrode, 304 denotes a side wall type polysilicon film constituting a part of the storage electrode and electrically connected to the polysilicon film 303, 305 denotes a capacitive insulating film, and 306 denotes a polysilicon film which constitutes a plate electrode. In FIG. 1, because the storage electrode of the memory cell capacitor is composed of the polysilicon film 303 and the side wall type polysilicon film 304 formed on the side surface of the polysilicon film 303, the side wall type polysilicon film 304 contributes to the increase of a surface area of the storage electrode, so that the capacity of the memory cell capacitor is increased. However, the increase of the capacity due to existence of the polysilicon film 304 of this side wall structure is only small.

Figure 1B:
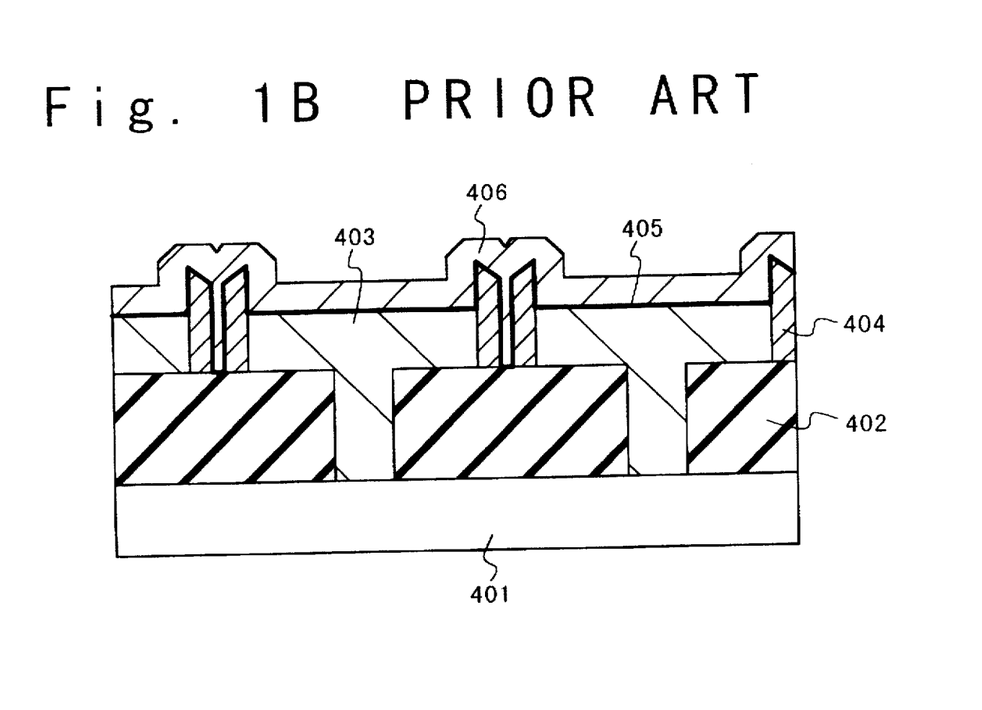
FIG. 1B is a cross sectional view illustrating the capacitor structure of another conventional DRAM having a stacked capacitor structure.

As technology for achieving a larger capacity of the memory cell capacitor, there is a capacitor having the structure in which side wall type polysilicon films protrude upward, i.e., a cylinder-type stack structure (to be referred to as "a conventional example 2"), as shown in FIG. 2. In FIG. 2, a reference numeral 401 denotes the silicon substrate, 402 denotes an insulating film, 403 denotes a polysilicon film which forms a main portion of a storage electrode, 404 denotes a side wall type polysllicon film constituting a part of the storage electrode, electrically connected to the polysilicon film 403 and protruding upwardly, 405 denotes a capacitive insulating film, and 406 denotes a polysilicon film which forms a plate electrode.

In the conventional example 2 shown in FIG. 2, because the structure in which the side wall type polysilicon film 404 protrudes upward, i.e., a vertical cylinder structure is used, the surface area of the storage electrode can be increased by the surface area inside and outside of the protruding portion of the polysilicon film 404, compared to the surface area of the storage electrode of the above-mentioned conventional example 1. Therefore, the memory cell capacitor having the structure of the conventional example 2 is configured to have the increased capacitor, which is much larger than the capacitor having the structure of the above-mentioned conventional example 1.

By the way, in the above-mentioned conventional example 2, it seems as if the capacity of the memory cell capacitor can be increased without any limitation if the height of the protruding potion of the polysilicon film 404 is increased in the upper direction. In the actual DRAM, however, there is the following problem. That is, after a memory cell capacitor is formed, when an insulating film is formed on the memory cell capacitor for forming an upper wiring layer, the surface height of the insulating film is greatly different between a memory cell section and a peripheral circuit section including circuits such as a decoder circuit or the like, if the height of the conductive film having the side wall structure is increased to increase the surface area of the storage electrode of the memory cell capacitor. In this case, in the lithography process for patterning the upper wiring layer and the lithography process for forming a contact to electrically connect the upper wiring layer to a gate electrode or diffusion layer of a MOS transistor located in the lower layer, if an optical focus is adjusted to one of the memory cell section and the peripheral circuit section, the optical focus shifts in the other section by the difference in the height of the insulating film between the memory cell section and the peripheral circuit section. As a result, it becomes difficult to resolve both of a pattern for the memory cell section and a pattern for the peripheral circuit section at the same time.

In order to solve this problem, in a case where the technique of flattening an insulating film such as chemical mechanical polishing (CMP) is applied to an insulating film on which the upper wiring pattern is to be formed after the memory cell capacitor is formed, the film thickness of the insulating film in the peripheral circuit section needs to be made very thick. For this reason, an aspect ratio of a contact hole provided in the peripheral circuit portion is also made large. As a result, in a case where the upper wiring pattern is provided, the coverage at the contact of the upper wiring layer becomes wrong and it is difficult to electrically connect the upper wiring layer and the lower gate electrode or diffusion layer.

In this manner, the higher the height of the side wall conductive film constituting a part of the storage electrode of the memory cell capacitor is made, the more serious the above problem becomes. For this reason, the height of the conductive film for the side wall structure has to be suppressed such that the problem is not fatal. As a result, the capacity increasing effect is also limited.

In the above-mentioned conventional example 2, when the height of the side wall type polysilicon film 404 is made constant, the surface area outside the side wall type polysilicon 404 is determined to a predetermined value. In order to increase the memory cell capacitor capacity under this condition, it is required that the polysilicon 403 constituting a part of the storage electrode is made thin as much as possible so that the surface area inside the side wall type polysilicon film 404 is increased such that the surface area of the storage electrode is made great as a whole.

In this case, however, if the polysilicon film 403 is made thin, the contact area consisting of a contact area between the polysilicon film 404 and the insulating film 402 and a contact area between the polysilicon film 404 and the polysilicon film 403 is remarkably decreased. As a result, the side wall type polysilicon film 404 is easily peeled off from the semiconductor substrate in processes necessary for increasing a manufacturing yield such as a rinsing process executed before the capacitive insulating film 405 is formed and an etching process of the silicon oxide film, resulting in the problem of reduction of the manufacturing yield.

SUMMARY OF THE INVENTION

Therefore, the present invention is made to solve the above problems. An object of the present invention is to provide a semiconductor memory device and a method of manufacturing the same, in which the capacity of a memory cell capacitor can be increased in the semiconductor memory device with a stacked capacitor structure.

Another object of the present invention is to provide a semiconductor memory device and a method of manufacturing the same, in which a side wall type conductive film constituting a part of the storage electrode of a memory cell capacitor can be prevented from peeling off from a semiconductor substrate.

In order to achieve an aspect of the present invention, a method of manufacturing a semiconductor memory device with a stacked capacitor structure, includes the steps of:

forming a MOS transistor on a substrate to have a gate electrode, a source region and a drain region;

forming an insulating film on the MOS transistor with an opening passing through the insulting film to one of the source and drain regions of the MOS transistor;

forming a conductive storage electrode connected to the one of the source and drain regions of the MOS transistor and having a first portion extending along a top surface of the insulating film and a second portion provided at each of edges of the first portion, and including a first subportion extending in an upper direction from an upper surface of the first portion and a second subportion below a lower surface of the first portion; and depositing a capacitive insulating film and a conductive plate electrode film on the capacitive insulating film to complete a memory cell capacitor with the conductive storage electrode, the capacitive insulating film and the conductive plate electrode.

The conductive storage electrode is formed by depositing a first conductive film on the insulating film and forming the first portion of the conductive storage electrode from the first conductive film, etching a surface portion of the insulating film where the first portion is not formed, and depositing a second conductive film and forming the storage electrode second portion from the second conductive film. In this case, in the etching of a surface portion of the insulating film, the surface portion of the insulating film where the first portion is not formed is isotropically etched back such that a recess portion of the insulating film is formed under each of edges of the conductive storage electrode first portion. The second conductive film is deposited such that the second conductive film fills the recess portions. The etching depth of the insulating film is desirably larger than 2.1 times of the film thickness of the second conductive film and is the film thickness of the upper insulating film at maximum, when the insulating film is formed of an upper insulating layer and a lower insulating layer. In this case, the second conductive film is deposited to extend along the surface of the recess portion while contacting a part of the lower surface of the storage electrode first portion. The first and second conductive films are preferably formed of a conductive polysilicon film. Also, the insulating film is preferably composed of a plurality of layers and the top layer is formed of a material having an etching rate different from the first insulating film.

In order to achieve another aspect of the present invention, a semiconductor memory device with a stacked capacitor structure, includes a MOS transistor formed on a substrate and having a gate electrode, a source region and a drain region, an insulating film formed on the MOS transistor, a conductive storage electrode connected to the one of the source and drain regions of the MOS transistor through the insulating film and having a first portion extending along a top surface of the insulating film and a second portion provided at each of edges of the first portion and including a first subportion extending in an upper direction from an upper surface of the first portion and a second subportion below a lower surface of the first portion, a capacitive insulating film, and a conductive plate electrode film on the capacitive insulating film, wherein a memory cell capacitor is composed of the conductive storage electrode, the capacitive insulating film and the conductive plate electrode.

In order to achieve still another aspect of the present invention, a semiconductor memory device with a stacked capacitor structure, includes a MOS transistor formed on a substrate and having a gate electrode, a source region and a drain region, an insulating film formed on the MOS transistor, a conductive storage electrode connected to one of the source and drain regions of the MOS transistor through the insulating film and having a first portion extending along a top surface of the insulating film and a second portion provided at each of edges of the first portion and including a first subportion extending in an upper direction from an upper surface of the first portion and a second subportion below a lower surface of the first portion to extend along a surface of a recess portion formed under the lower surface of the first portion at the edge, a capacitive insulating film, and a conductive plate electrode film on the capacitive insulating film, wherein a memory cell capacitor is composed of the conductive storage electrode, the capacitive insulating film and the conductive plate electrode.

BRIEF DESCRIPTION OF THE PREFERRED EMBODIMENTS

DESCRIPTION OF THE PREFERRED EMBODIMENTS

The semiconductor memory device of the present invention will be described below in detail with reference to the accompanying drawings.

Figure 2:
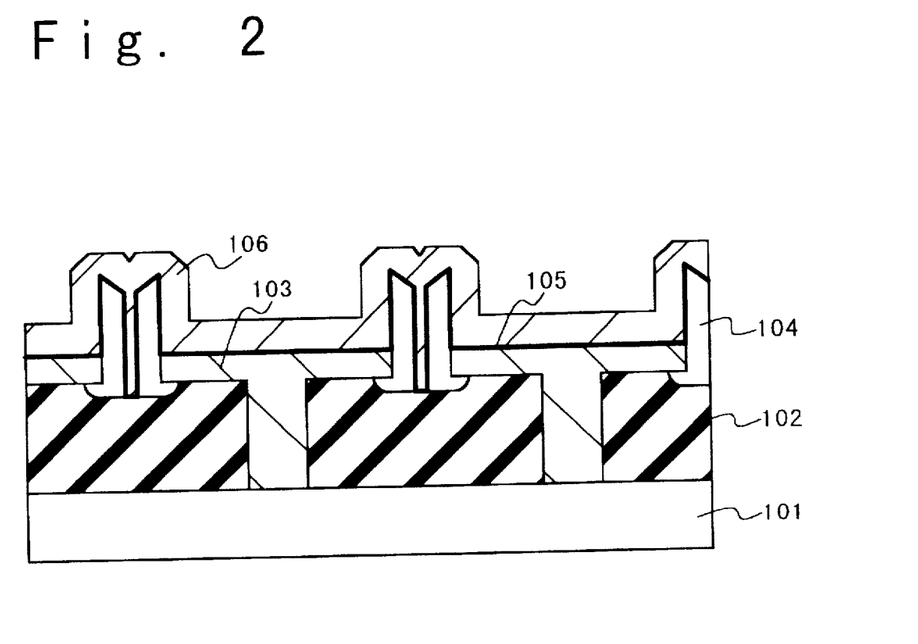
FIG. 2 is a cross sectional view illustrating the capacitor structure of a DRAM having a stacked capacitor structure according to a first embodiment of the present invention.

FIG. 2 is a cross sectional view illustrating the capacitor structure of a dynamic random access memory (DRAM)

having a stacked capacitor structure according to the first embodiment of the present invention. Referring first to FIG. 2, an insulating film 102 is formed on a silicon substrate 101. The semiconductor memory device includes a storage electrode composed of a polysilicon film 103 as a first conductive film and a polysilicon film 104 as a second conductive film electrically connected to the polysilicon film 103 and extending in an upper direction from the polysilicon film 103 and also extending in a lower direction from the polysilicon film 103.

Next, a method of manufacturing the semiconductor device will be described below in detail.

Figure 3A:
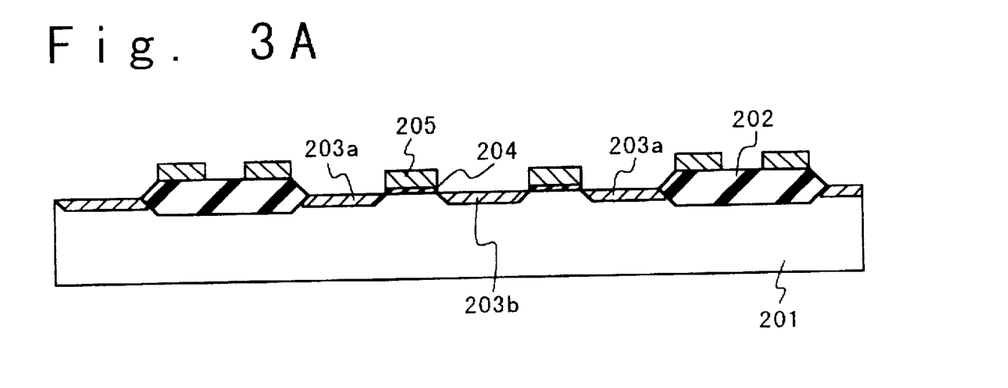
FIGS. 3A to 3G are cross sectional views of the DRAM with the stacked capacitor structure in the manufacturing processes of the DRAM according to the first embodiment of the present invention.

FIGS. 3A to 3G are cross sectional views of the DRAM with the stacked capacitor structure in the manufacturing processes of the DRAM according to the first embodiment of the present invention. Referring first to FIG. 3A, an element separating region 202 and a metal-oxide-semiconductor (MOS) transistor are formed on the surface of a P-type silicon substrate 201. The MOS transistor is composed of a source region 203a and drain region 203b which, are both a N-type diffusion layer, and a gate electrode 205 formed on the silicon substrate 201 via a gate insulating film 204 and formed of a polysilicon film in which phosphor (P) is doped. Wiring patterns of polysilicon are formed on the element separating region 202.

Figure 3B:
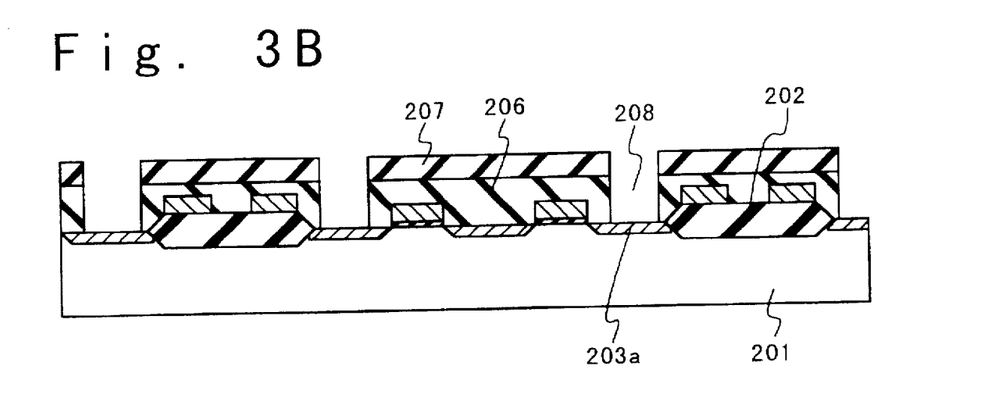

Next, the surface of the substrate 201 is covered by an first insulating film 206 and a second insulating film 207 in this order. The second insulating film 207 is desirably formed of, for example, a silicon nitride film of 350 nm in thick. When the second insulating film is etched to be described later, the first insulating film 206 can function as an etching stopper. The first insulating film 206 may have 2-layer structure of a silicon oxide layer and a BPSG layer to have a flat surface. Also, a surface flattening technique may be applied to the first insulating film 206, if necessary. As a result, the second insulating film can be formed with a uniform surface height. The second insulating film (the silicon nitride film) 207 is used as an etching stopper when a silicon oxidation film 210 is etched back as described later. Then, a contact hole 208 is formed in the first and second insulating films 206 and 207 to electrically connect a storage electrode of the memory cell capacitor to the source regions of the MOS transistor, as shown in FIG. 3B.

Figure 3C:
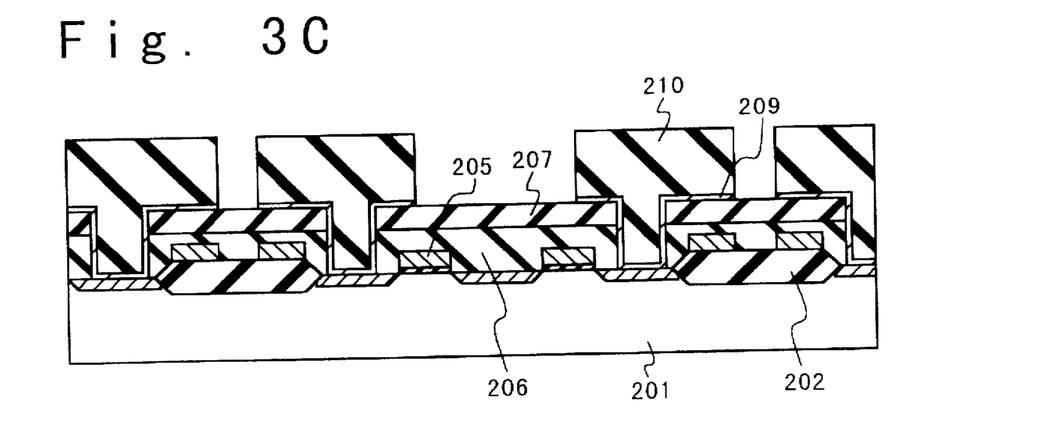

Next, a phosphor-doped polysilicon film 209 is formed to have the film thickness of 50 nm and then a silicon oxide film 210 having the film thickness of 500 nm is formed on the polysilicon film 209. Here, the film thickness of the silicon oxide film 210 defines the height of side wall section as a part of the storage electrode of the memory cell capacitor to be formed later. Subsequently, the polysilicon film 209 and the silicon oxide film 210 are patterned to have a desired pattern, as shown in FIG. 3C. As a result, the patterned polysilicon film 209 constitutes the main portion of the storage electrode of the memory cell capacitor. In this case, the second insulating film 207 functions as an etching stopper.

Figure 3D:
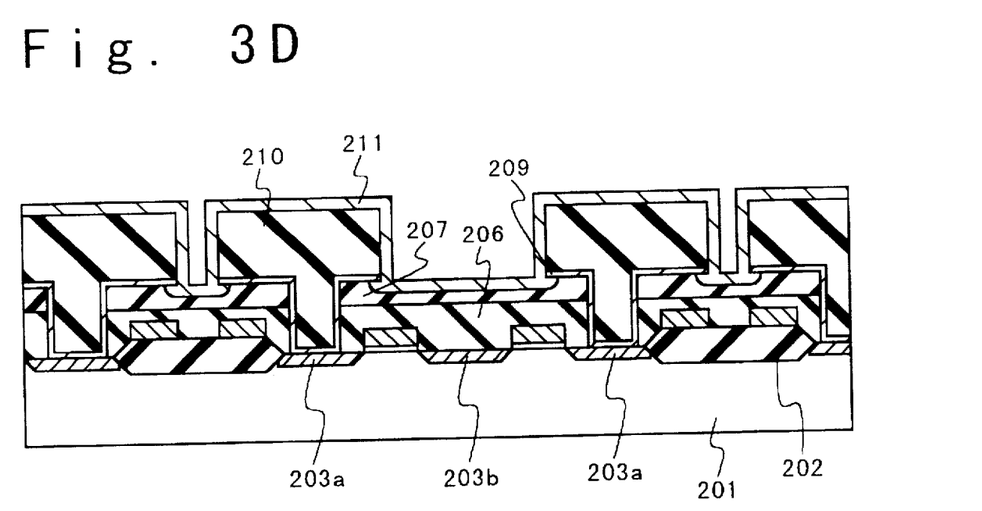

Next, isotropic etching is executed to the exposed surface portion of the second insulating film 207 of the silicon nitride film by about 150 nm in depth. This isotropic etching may be performed as wet etching or dry etching by appropriately selecting etching gas and an etching condition. As a result, a space called a notch or recess portion, is formed under each of edge portions of the patterned polysilicon film 209 with a predetermined region. After that, a phosphor-doped polysilicon film 211 is deposited on the semiconductor surface to have the film thickness of, for example, 100 nm. At the same time, the recess or notch portion under the edge of the patterned polysilicon film 209 is filled with the with the phosphor-doped polysilicon film 211, as shown in FIG. 3D.

Figure 3E:
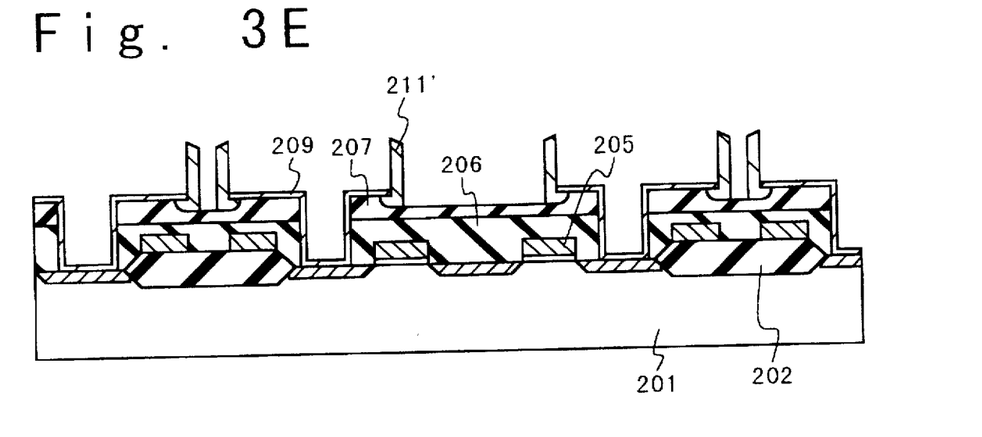

Next, the polysilicon film 211 is anisotropically etched back to form a polysilicon film section 211' having a side wall structure, which constitutes a part of the storage electrode of the memory cell capacitor. The polysilicon film section 211' is electrically connected to the patterned polysilicon film 209, which acts as the main potion of the storage electrode of the memory cell capacitor. Also, in the edge portion of the patterned polysilicon film 209, the polysilicon film section 211' protrudes in an upper direction from the upper surface of the patterned polysilicon film 209 and extends in a lower direction from the lower surface of the patterned polysilicon film 209. Moreover, the silicon oxide film 210 is removed through the anisotropically etching, using the second insulating film 207 of the silicon nitride film, which has a partially thinner portion, as an etching stopper. As a result, the cross sectional structure shown in FIG. 3E is achieved.

Figure 3F:
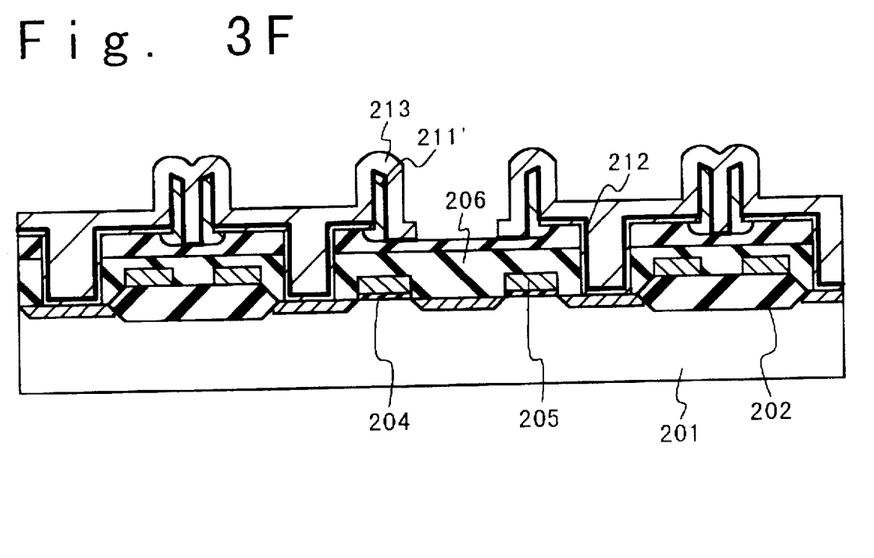

Next, a capacitive insulating film 212 is formed to cover the semiconductor surface. Subsequently, a phosphor-doped polysilicon film 213 is deposited on the capacitive insulating film 212, as shown in FIG. 3F. The capacitive insulating film 212 functions as a dielectric layer of the memory cell capacitor. The polysilicon film 213 constitutes a plate electrode of the memory cell capacitor.

Figure 3G:
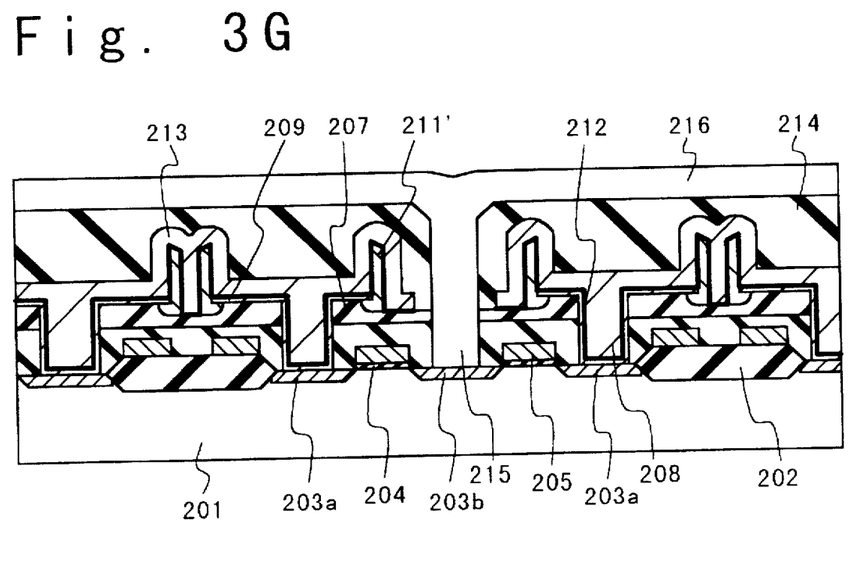

Next, an interlayer insulating film 214 is formed and a contact hole 215 is formed to reach the drain region 203b of the MOS transistor. Then, a digit line 216 is formed. As a result, the semiconductor memory device according to the first embodiment of the present invention is achieved as shown in FIG. 3G.

Figure 4A:
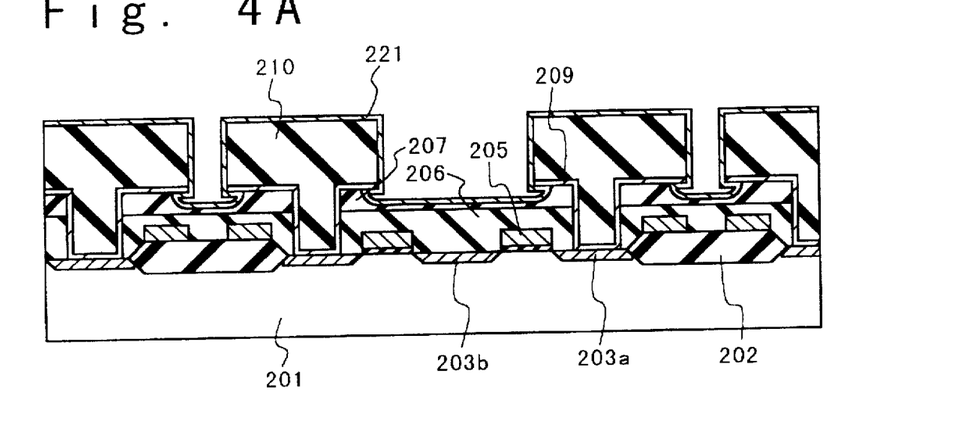
FIGS. 4A to 4C are cross sectional views of the DRAM with the stacked capacitor structure in the manufacturing processes of the DRAM according to a second embodiment of the present invention.
Figure 4B:
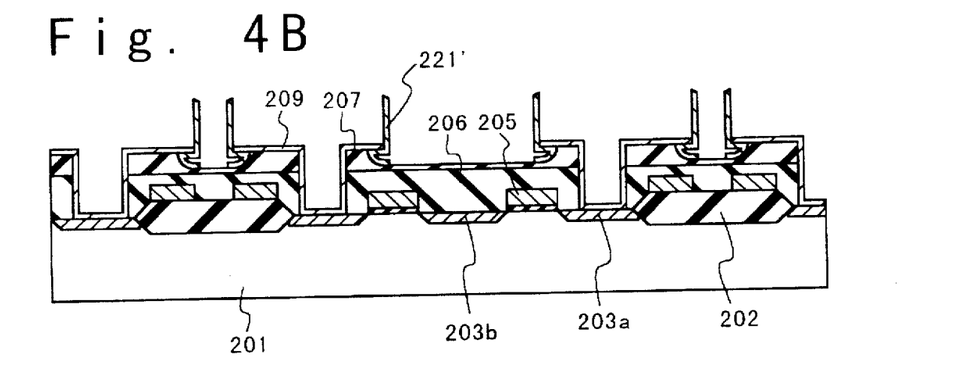
Figure 4C:
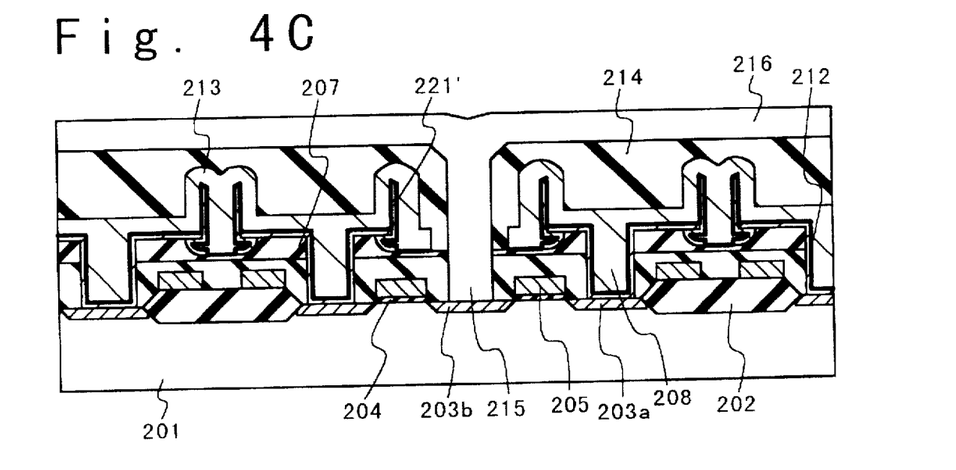

Next, the semiconductor memory device according to the second embodiment of the present invention will be described below. FIGS. 4A to 4C are cross sectional views for explaining the manufacturing method of the semiconductor memory device of the second embodiment.

In the semiconductor memory device of the present embodiment, after the cross sectional structure shown in FIG. 3C is formed using the same method as in the first embodiment, the isotropic etching back process is executed to the exposed surface of the second insulting film 207 of the silicon nitride film of 350 nm such that the second insulating film 207 is removed from the exposed surface by the thickness in a range from 2.1 times of the film thickness of the polysilicon film 221, which is formed later, to a predetermined thickness of the second insulating film, e.g., 300 nm. As a result, a recess portion greater than that in the first embodiment is formed under each of the edge portions of the patterned polysilicon film 209 constituting a main portion of the storage electrode of the memory cell capacitor. Then, a phosphor-doped polysilicon film 221 is deposited to have the film thickness of, for example, 100 nm. In the greater recess portion, the polysilicon film 221 is formed along the surface of the greater recess portion such that the polysilicon film 221 have a lateral concave portion on the surface, as shown in FIG. 4A.

Next, the polysilicon film 221 is isotropically etched back to form a side wall structure 221' constituting a part of the storage electrode of the memory cell capacitor. The polysilicon side wall structure 221' extends in an upper direction from the upper surface of the polysilicon film 209 and extends in a lower direction from the lower surface of the polysilicon film 209 and further has the lateral concave portion in the greater space portion. The polysilicon side wall structure 221' is electrically connected to the patterned polysilicon film 209. Subsequently, the silicon oxide film 210 is removed by etching, using the silicon nitride film 207 as the second insulating film as an etching stopper. As a result, the cross sectional structure shown in FIG. 4B is accomplished.

Next, a capacitive insulating film 212 is formed to cover the semiconductor surface. Subsequently, a phosphor-doped polysilicon film 213 is deposited on the capacitive insulating film 212. The capacitive insulating film 212 functions as a dielectric layer of the memory cell capacitor. The polysilicon film 213 constitutes a plate electrode of the memory cell capacitor. Subsequently, an interlayer insulating film 214 is formed and a contact hole 215 is formed to reach the drain region 203b of the MOS transistor. Then, a digit line 216 is formed. As a result, the semiconductor memory device according to the second embodiment of the present invention is achieved as shown in FIG. 4C.

According to the semiconductor memory device of the second embodiment, the side wall structure 221' constituting a part of the storage electrode of the memory cell capacitor has a protruding portion extending in an upper direction from the upper surface of the patterned polysilicon film 209 constituting a main portion of the storage electrode of the memory cell capacitor and a portion extending in a lower direction from the lower surface of the patterned polysilicon film 209 and protruding in a lateral direction under the edge of the patterned polysilicon film 209. Therefore, the surface area of the side wall structure 221' in the second embodiment is greater than that of the side wall structure 211' in the first embodiment by the surface area of the recess portion. As a result, the capacity of the memory cell capacitor in the second embodiment is increased in capacity more than the memory cell capacitor in the first embodiment.

For instance, if the contact area of the storage electrode and the capacitive insulating film is Sa in the first embodiment and the contact area of the storage electrode and the capacitive insulating film is Sb in the second embodiment, Sb=2.7×Sb when the patterned polysilicon film 209 and the polysilicon side wall structure 221' in the second embodiment is the same as those in the second embodiment. In this manner, the contact area is increased so that the capacity of the memory cell capacitor can be increased plural times.

According to the present invention, the side wall structure has a lateral protruding portion or a recess portion contacting the patterned polysilicon film. Therefore, the fitness between the side wall structure and the lateral protruding portion is increased and, as a result of this, the side wall structure can be prevented from being peeling off from the semiconductor substrate in a preprocess such as a rinsing process executed before the capacitive insulating film is formed for increasing a manufacturing yield and an etching process of a silicon oxide film.

Also, if the insulating film 207 is anisotropically etched back, the surface area of the storage electrode can be increased so that the capacity of the memory cell capacitor can be increased.

What is claimed is:

1. A method of manufacturing a semiconductor memory device with a stacked capacitor structure, comprising the steps of:

forming a MOS transistor on a substrate to have a gate electrode, a source region and a drain region;

forming an insulating film on said MOS transistor with an opening passing through said insulting film to one of the source and drain regions of said MOS transistor;

forming a conductive storage electrode connected to said one of the source and drain regions of said MOS transistor and having a first portion extending along a top surface of said insulating film and a second portion provided at each of edges of said first portion, and including a first subportion extending in an upper direction from an upper surface of said first portion and a second subportion below a lower surface of said first portion; and depositing a capacitive insulating film and a conductive plate electrode film on said capacitive insulating film to complete a memory cell capacitor with said conductive storage electrode, said capacitive insulating film, and said conductive plate electrode.

2. A method according to claim 1, wherein said step of forming a conductive storage electrode comprises the steps of:

depositing a first conductive film on said insulating film and forming said first portion of said conductive storage electrode from said first conductive film;

etching a surface portion of said insulating film where said first portion is not formed; and depositing a second conductive film and forming said storage electrode second portion from the second conductive film.

3. A method according to claim 2, wherein said step of etching a surface portion of said insulating film includes isotropically etching the surface portion of said insulating film where said first portion is not formed such that a recess portion of said insulating film is formed under each of edges of said conductive storage electrode first portion.

4. A method according to claim 3, wherein said depositing a second conductive film includes depositing said second conductive film such that said second conductive film fills said recess portions.

5. A method according to claim 3, wherein the etching depth of said insulating film is larger than 2.1 times of the film thickness of said second conductive film.

6. A method according to claim 5, wherein said insulating film is formed of an upper insulating layer and a lower insulating layer, and the etching depth of said insulating film is the film thickness of the upper insulating film at maximum.

7. A method according to claim 5, wherein said step of depositing a second conductive film includes depositing the second conductive film to extend along the surface of the recess portion while contacting a part of the lower surface of said storage electrode first portion.

8. A method according to claim 2, wherein said first and second conductive films are formed of a conductive polysilicon film.

9. A method according to claim 2, wherein said step of forming said first portion of said conductive storage electrode from said first conductive film includes:

depositing a first insulating film; and selectively etching said second conductive film and said first insulating film, and wherein said forming said storage electrode second portion from the second conductive film includes etching said first insulating film and said second conductive film such that said second portion is remained and whole of said first insulating film is removed, and wherein said insulating film is composed of a plurality of layers and the top layer is formed of a material having an etching rate different from said first insulating film.

10. A semiconductor memory device with a stacked capacitor structure, comprising:

a MOS transistor formed on a substrate and having a gate electrode, a source region and a drain region;

an insulating film formed on MOS transistor;

a conductive storage electrode connected to said one of the source and drain regions of said MOS transistor through said insulating film and having a first portion extending along a top surface of said insulating film and a second portion provided at each of edges of said first portion and including a first subportion extending in an upper direction from an upper surface of said first portion and a second subportion below a lower surface of said first portion;

a capacitive insulating film; and a conductive plate electrode film on said capacitive insulating film, wherein a memory cell capacitor is composed of said conductive storage electrode, said capacitive insulating film, and said conductive plate electrode.

11. A semiconductor memory device according to claim 10, wherein said insulating film has a recess portion under each of edges of said conductive storage electrode first portion, and wherein said second subportion fills said recess portions.

12. A semiconductor memory device according to claim 10, wherein said first and second portions of said conductive storage electrode are formed of a conductive polysilicon film.

13. A semiconductor memory device according to claim 10, wherein said insulating film is composed of a plurality of layers.

14. A semiconductor memory device according to claim 13, wherein the top layer of said insulating film is formed of silicon nitride.

15. A semiconductor memory device with a stacked capacitor structure, comprising:

a MOS transistor formed on a substrate and having a gate electrode, a source region and a drain region;

an insulating film formed on said MOS transistor;

a conductive storage electrode connected to one of the source and drain regions of said MOS transistor through said insulating film and having a first portion extending along a top surface of said insulating film and a second portion provided at each of edges of said first portion and including a first subportion extending in an upper direction from an upper surface of said first portion and a second subportion below a lower surface of said first portion to extend along a surface of a recess portion formed under the lower surface of said first portion at the edge;

a capacitive insulating film; and a conductive plate electrode film on said capacitive insulating film, wherein a memory cell capacitor is composed of said conductive storage electrode, said capacitive insulating film, and said conductive plate electrode.

16. A semiconductor memory device according to claim 15, wherein a height of the recess portion of said insulating film is larger than 2.1 times of the film thickness of said second portion.

17. A semiconductor memory device according to claim 16, wherein said insulating film is formed of an upper insulating layer and a lower insulating layer, and the etching depth of said insulating film is the film thickness of the upper insulating film at maximum.

18. A semiconductor memory device according to claim 16, wherein said first and second portions of said conductive storage electrode are formed of a conductive polysilicon film.

19. A semiconductor memory device according to claim 15, wherein said insulating film is composed of a plurality of layers.

20. A semiconductor memory device according to claim 19, wherein the top layer of said insulating film is formed of silicon nitride.

* * * * *